United States Patent [19]

Wittke

[11] Patent Number: 4,659,170

[45] Date of Patent: Apr. 21, 1987

[54] PACKAGES FOR ELECTRO-OPTIC DEVICES

[75] Inventor: James P. Wittke, Princeton, N.J.

[73] Assignee: RCA Corporation, Princeton, N.J.

[21] Appl. No.: 518,732

[22] Filed: Jul. 29, 1983

[51] Int. Cl.⁴ .............................................. G02B 5/22
[52] U.S. Cl. ..................................... 350/1.1; 350/319;
357/17; 357/30; 357/74
[58] Field of Search ............. 350/589, 319, 1.1, 96.34;
357/74, 17, 30

[56] References Cited

U.S. PATENT DOCUMENTS

| 3,555,450 | 1/1971 | Rockwell, Jr. | 350/319 |
| 3,717,823 | 2/1973 | Abdale et al. | 350/319 |
| 3,816,847 | 6/1974 | Nagao | 357/74 |
| 4,013,501 | 3/1977 | Van Uitert et al. | 156/605 |
| 4,076,955 | 2/1978 | Gates, Jr. | 357/74 |
| 4,131,911 | 12/1978 | Fujine et al. | 357/74 |
| 4,326,214 | 4/1982 | Trueblood | 357/74 |
| 4,403,243 | 9/1983 | Hakamada | 357/74 |
| 4,536,442 | 8/1985 | Bovenkerk et al. | 428/323 |

FOREIGN PATENT DOCUMENTS 1291634 3/1969 Fed. Rep. of Germany.

OTHER PUBLICATIONS

Webster's Third New International Dictionary, G. & C. Merriam Co., 1961, p. 1525.

Primary Examiner—William L. Sikes
Assistant Examiner—Frank González
Attorney, Agent, or Firm—B. E. Morris

[57] ABSTRACT

Yttrium aluminum garnet is employed as a light-transmissive window for electro-optic device packages. This material is resistant to high amounts of atomic radiation.

4 Claims, 1 Drawing Figure

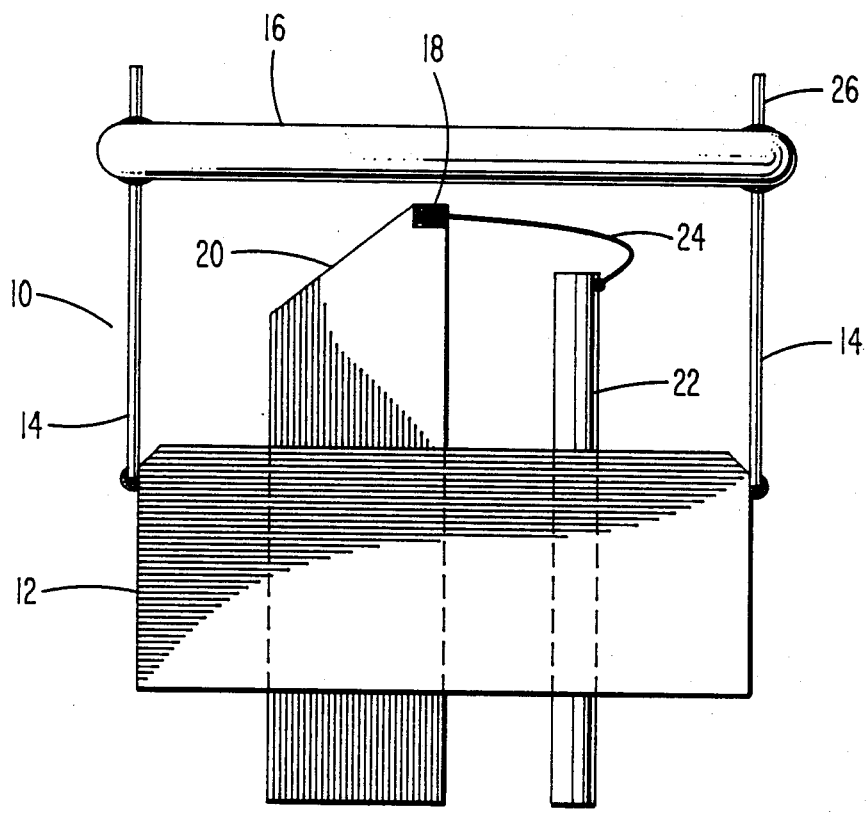

PACKAGES FOR ELECTRO-OPTIC DEVICES

The U.S. Government has rights to this invention pursuant to a Government contract.

This invention relates to an optical window in a hermetically sealed package for electro-optic devices. More particularly, this invention relates to an optical window that is resistant to degradation or discoloration in the presence of high amounts of radiation.

BACKGROUND OF THE INVENTION

Electro-optical semiconductor devices, such as laser or semiconductor diodes or detectors, are enclosed in hermetically sealed packages for protection and ease of alignment of the device with, for example, optical fibers. A light-transmissive window must be present in the package to allow light to pass into or out of the package.

When the devices are to be used in outer space, for example, where large amounts of high energy levels of radiation are present, the material of the window must be resistant to discoloration, degeneration or other degradation of its optical transmission properties in the presence of radiant energy.

In addition, the windows must be able to be coated with standard anti-reflection coatings and to be brazed or otherwise cemented into the package without physical distortion or undue stresses being imparted to the window material.

In the past quartz has been employed as a window material for optical device packages because quartz does not discolor in the presence of high levels of atomic radiation. However, its thermal expansion coefficient is lower than most metals, so it has not been possible to braze metal seals to the quartz without significantly distorting or warping the quartz window, particularly over the broad temperature ranges encountered in hermetic-seal brazes.

SUMMARY OF THE INVENTION

I have found that yttrium aluminum garnet (YAG) is an ideal material for hermetically sealed package windows for electro-optic semiconductor devices. This material is available as a colorless crystal that is relatively impervious to high amounts of radiant energy and has a good thermal expansion match to metals useful in brazing the window material to a package.

BRIEF DESCRIPTION OF THE DRAWING

The FIGURE shows a cross-sectional view of a laser diode encapsulated in a package of the invention.

DETAILED DESCRIPTION OF THE INVENTION

YAG is available in large cross-section crystals having good optical quality. This material has excellent resistance to high doses of atomic energy. For example, irradiation with gamma-rays from a $Co^{60}$ source at $10^6$ Rad levels causes only small losses in transmission. This can be shown in the following Table where a 0.030" (0.07 cm) thick slice of YAG crystal was measured after exposure of the crystal to the above radiation using a spectrophotometer for the measurement.

TABLE 1

| Wavelength $\lambda$, $\mu m$ | Absorption Coefficient $\Delta\alpha$, $cm^{-1}$ | Transmission (0.030" thick window) |
|---|---|---|
| .90 | ~0 | 1.000 |
| .80 | .09 | .99 |
| .70 | .18 | .99 |
| .60 | .35 | .97 |
| .50 | .53 | .96 |
| .40 | .88 | .94 |
| .30 | .91 | .93 |

The above TABLE shows that for light throughout the visible spectrum the transmission loss for a 0.03" thick window is well below 10%. In the near infra-red regions, where optical devices such as semiconductor diodes have their useful emission, there was little if any loss in transmission. Thus YAG is relatively impervious to high energy degradation, and indeed qualifies as a "radiation-hard" material.

Referring now to the FIGURE, the mounted and encapsulated laser is shown as package 10. The encapsulating package 10 includes a base 12 to which is welded hermetically a metal sleeve 14. Brazed to the metal sleeve 14 is a transparent window 16 which allows the light from the laser 18 to be emitted from the package 10. The laser 18 is mounted to a copper heat-sink 20 and to insulated electrical leads 22 by a wire 24.

In order to assemble a completely hermetically sealed package for a semiconductor laser for example, a semiconductor diode is bonded to a copper heat-conducting sink or post and mounted on a base. A cap comprising the YAG window in the shape of a disk about 0.5" (1.27 cm) in diameter and 0.03' thick is mounted on a sleeve, suitably a ring of Kovar, an iron alloy containing about 29% of nickel, about 17% of cobalt, and 0.3% of manganese. This alloy has a thermal coefficient of expansion closely matched to YAG. The ring can be about ⅛" (0.32 cm) long and about 0.010" (0.025 cm) thick. A paste of molybdenum powder in a silicate base about 0.04" (0.10 cm) wide is deposited around the circumference of the window and the window is fired in a furnace in wet hydrogen at about 1550° C. to form an adherent metal coating. Next a coating, as of nickel, is applied to the molybdenum to define the metallization wettable by a braze. The nickel can be applied by plating or a nickel-containing paste can be applied over the molybdenum and fired. The nickel improves the wettability to the braze materials.

The iron alloy sleeve is also nickel-coated to prevent the corrosion of the iron.

The YAG window and the iron alloy sleeve are assembled and brazed together using a suitable braze material, such as Incusil 15, available from GTE Wesgo, which solidifies at about 630° C.

The cap is mounted over the header which includes the heat sink, the leads and the base, so that the optical axis of the diode is perpendicular to the window surface, and the distance between the output diode facet and the surface of the window adjusted to the desired spacing. The metal sleeve of the cap is then welded to the base of the header using an appropriate welding torch to make a plurality of welds around the sleeve.

The assembly is then dried in a vacuum oven, dry nitrogen or other inert gas is fed to the assembly and a final ring weld around the metal sleeve of the cap forms a moisture-proof hermetic seal between the cap and the header.

To further ensure that the YAG window will retain its flatness during the brazing step, a thin shim of a low coefficient of expansion metal, such as tungsten, tantalum or iridium, can be placed between the metallized window and its sleeve. Alternatively, a companion iron alloy sleeve 26 with a protective nickel coating can also be brazed to the outside periphery of the YAG window, also molybdenum-metallized and nickel-coated. This arrangement, which forms a sandwich around the YAG window, will also serve to avoid distortion or warp of the window during the brazing step.

Although the invention has been particularly described with respect to a semiconductor laser diode package, with electro-optic device packages can be readily substituted as will be known to one skilled in the art. In any event the invention is not meant to be limited to the details described herein but only by the appended claims.

I claim:

1. In a hermetically sealed package for an electro-optic device comprising an electro-optic device mounted on a header and a cap comprising a metal sleeve bonded to a light-transmissive window sealed to the header so that the light-transmissive window is perpendicular to the optical axis of the device, the improvement which comprises employing an yttrium aluminum garnet crystal as the light-transmissive window.

2. A package according to claim 1 wherein the electro-optic device is a semiconductor diode that transmits in the infra-red porion of the spectrum.

3. A package according to claim 1 wherein the sleeve is made of an iron alloy having a thermal coefficient of expansion about the same as yttrium aluminum garnet.

4. A package according to claim 1 wherein the yttrium aluminum garnet window is inserted between two iron alloy sleeves.

* * * * *